United States Patent
Hsieh et al.

(10) Patent No.: US 11,671,236 B2
(45) Date of Patent: Jun. 6, 2023

(54) RECEIVER AND ASSOCIATED SIGNAL PROCESSING METHOD

(71) Applicant: Realtek Semiconductor Corp., HsinChu (TW)

(72) Inventors: Yi-Chun Hsieh, HsinChu (TW); Yi-Chun Hsieh, HsinChu (TW); Pei-Tse Chiang, HsinChu (TW); Chih-Kai Chien, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 17/523,877

(22) Filed: Nov. 10, 2021

(65) Prior Publication Data

US 2022/0231828 A1 Jul. 21, 2022

(30) Foreign Application Priority Data

Jan. 15, 2021 (TW) .................. 110101537

(51) Int. Cl.
| | |
|---|---|
| *H04L 7/00* | (2006.01) |
| *H04L 25/49* | (2006.01) |
| *H03K 9/08* | (2006.01) |
| *H03M 5/08* | (2006.01) |

(52) U.S. Cl.
CPC ............ *H04L 7/0079* (2013.01); *H03K 9/08* (2013.01); *H03M 5/08* (2013.01); *H04L 7/0016* (2013.01); *H04L 25/4902* (2013.01)

(58) Field of Classification Search
CPC ........ H03K 9/08; H03K 5/125; H03K 5/1252; G11B 20/1411; H04L 7/0079; H04L 7/0016; H04L 7/033; H04L 7/0331; H04L 25/4902; H04N 21/4305; H03M 5/08
See application file for complete search history.

(56) References Cited

U.S. PATENT DOCUMENTS

| | | | | |
|---|---|---|---|---|
| 6,456,134 | B2 * | 9/2002 | Niijima | H03K 9/08 |
| | | | | 377/16 |
| 6,947,493 | B2 * | 9/2005 | Cohen | H03M 5/08 |
| | | | | 375/295 |
| 9,031,153 | B2 * | 5/2015 | Den Besten | H04L 25/4902 |
| | | | | 375/295 |

FOREIGN PATENT DOCUMENTS

| | | |
|---|---|---|
| TW | 201526628 A | 7/2015 |
| TW | 201843936 A | 12/2018 |

* cited by examiner

*Primary Examiner* — Betsy Deppe
(74) *Attorney, Agent, or Firm* — Winston Hsu

(57) ABSTRACT

The present invention provides a receiver including a sampling circuit, a data sampling point selection circuit and a determination circuit. The sampling circuit is configured to use a clock signal to sample an input signal to generate a sampled signal, wherein a frequency of the clock signal is greater than a frequency of the input signal. The data sampling point selection circuit is configured to filter start point data to generate a filtered start point data, and to generate a data sampling point by adding an offset to the filtered start point data, wherein the start point data corresponds to a time point that a sampled value of sampled signal starts to change. The determination circuit is configured to refer to a sampled value corresponding to the data sampling point in the sampled signal to determine a logical value of a digital output signal corresponding to the input signal.

11 Claims, 5 Drawing Sheets

RECEIVER AND ASSOCIATED SIGNAL PROCESSING METHOD

BACKGROUND OF THE INVENTION

1. Field of the Invention

The present invention relates to a receiver arranged in an electronic device, and more particularly, to a receiver that is capable of accurately determining a duty cycle of an audio signal to further determine a logical value of a digital output signal, and an associated processing method for performing foregoing determinations.

2. Description of the Prior Art

In accordance with the specification of Enhanced Audio Return Channel (eARC) in High Definition Multimedia Interface (HDMI), an audio signal generally has two different duty cycles (which are respectively 40% and 60%), and the receiver will determine a corresponding logical value according to the duty cycle of the received audio signal. For example, when the duty cycle of the audio signal received by the receiver is 40%, the receiver will output a logical value "0" to the back-end circuit for subsequent processing; and when the duty cycle of the audio signal received by the receiver is 60%, the receiver will output a logical value "1" to the back-end circuit. However, due to that fact that jitter may occur in audio signal, the error of the receiver in judging the duty cycle of the audio signal is increased, which further affects the correctness of the output logical value.

SUMMARY OF THE INVENTION

One of the objectives of the present invention is to provide a receiver arranged in an electronic device and being capable of accurately determining a duty cycle of an audio signal to further determine a logical value of a digital output signal, to solve the aforementioned problems of prior arts.

An embodiment of the present invention discloses a receiver including a sampling circuit, a data sampling point selection circuit and a determination circuit. The sampling circuit is configured to use a clock signal to sample an input signal to generate a sampled signal. A frequency of the clock signal is greater than a frequency of the input signal. The data sampling point selection circuit is coupled to the sampling circuit, and is configured to filter a start point data to generate a filtered start point data, and to generate a data sampling point by adding an offset to the filtered start point data. The start point data corresponds to a time point at which a sampled value of sampled signal starts to change. The determination circuit is coupled to the data sampling point selection circuit, and is configured to refer to a sampled value corresponding to the data sampling point in the sampled signal to determine a logical value of a digital output signal corresponding to the input signal.

An embodiment of the present invention further discloses a signal processing method applied to a receiver including: using a clock signal to sample an input signal to generate a sampled signal, wherein a frequency of the clock signal is greater than a frequency of the input signal; filtering a start point data to generate a filtered start point data, wherein the start point data corresponds to a time point at which a sampled value of sampled signal starts to change; generating a data sampling point by adding an offset to the filtered start point data; and refer to a sampled value corresponding to the data sampling point in the sampled signal to determine a logical value of a digital output signal corresponding to the input signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
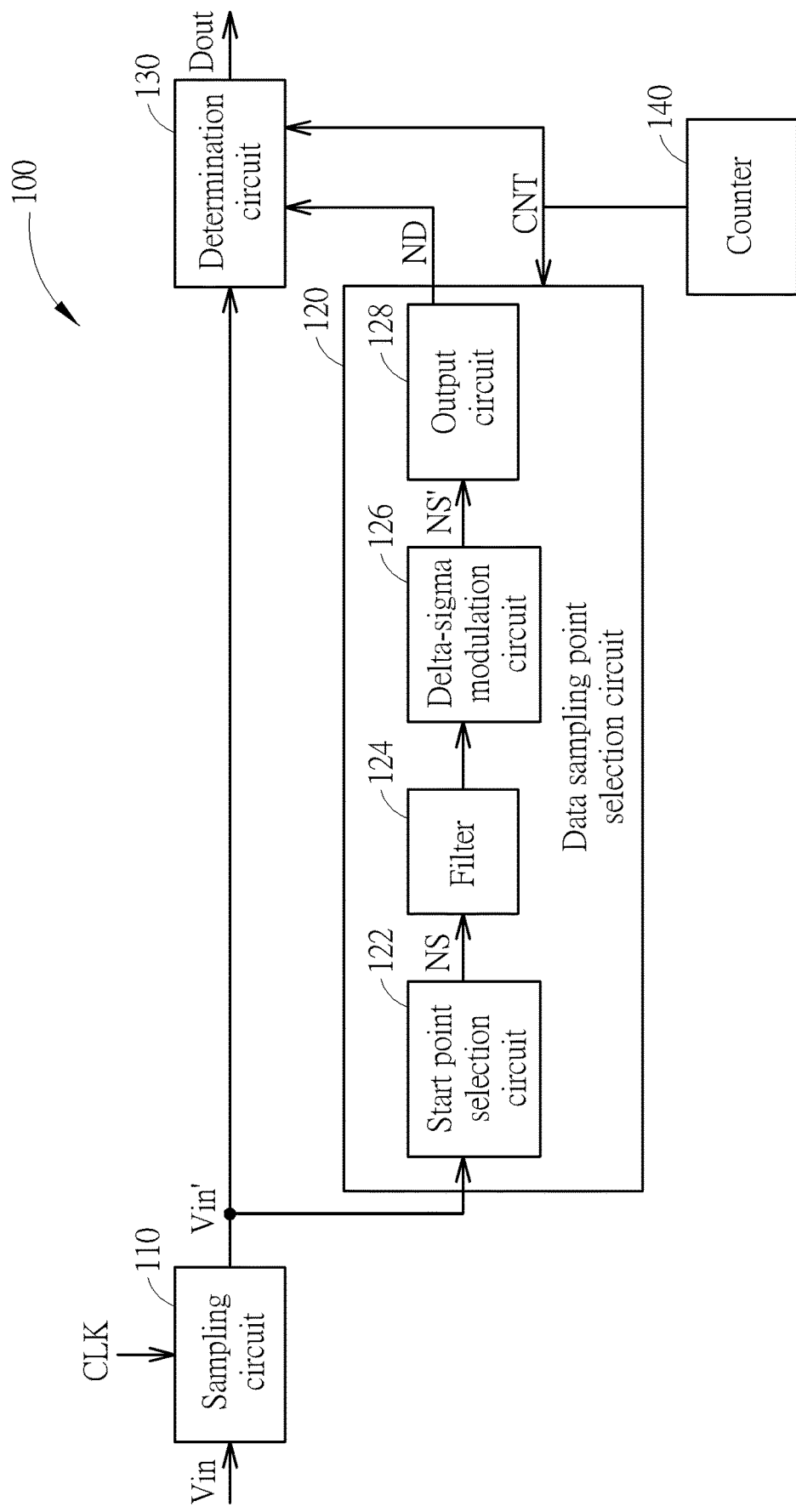
FIG. 1 is a diagram illustrating a receiver according to an embodiment of the present invention.
Figure 2:
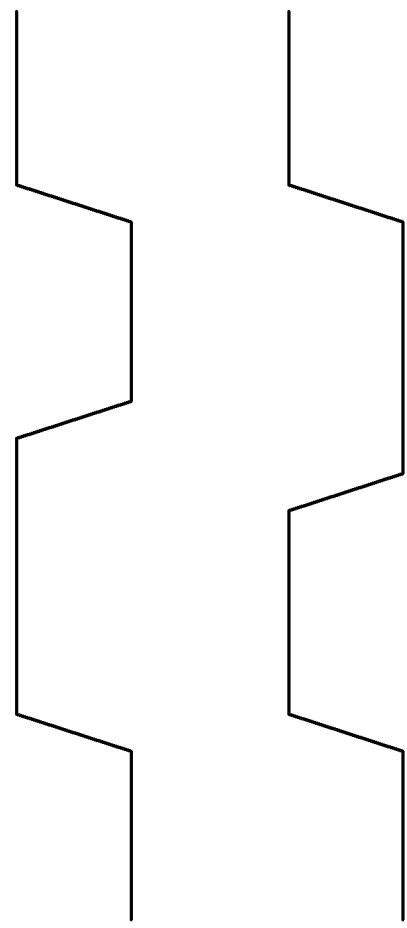
FIG. 2 is a diagram illustrating the input signal including two different duty cycles and corresponding logical values.

FIG. 1 is a diagram illustrating a receiver 100 according to an embodiment of the present invention. As shown in FIG. 1, the receiver 100 includes a sampling circuit 110, a data sampling point selection circuit 120, a determination circuit 130 and a counter 140, where the data sampling point selection circuit 120 includes a start point selection circuit 122, a filter 124, a delta-sigma modulation circuit 126 and an output circuit 128. In this embodiment, the receiver 100 is applied to an enhanced audio return channel (eARC) in a high definition multimedia interface (HDMI). For example, the receiver 100 may be a receiver installed in an electronic device (such as a television) and configured to receive audio signals. In addition, the receiver 110 is configured to determine whether a duty cycle of an input signal Vin is 40% or 60%, but not limited thereto, to further determine a logical value of a digital output signal Dout. For example, as shown in FIG. 2, when the duty cycle of the input signal Vin is 60% (the signal waveform is shown in the upper part of the figure), the logical value of the digital output signal Dout is "1", and when the duty cycle of the input signal Vin is 40% (the signal waveform is shown in the lower part of the figure), the logical value of the digital output signal Dout is "0". For the convenience of the following description, the receiver 100 is described in terms of being applied to the specification of eARC, but the present invention is not limited thereto.

In the operation of the receiver 100, the sampling circuit 110 uses a clock signal CLK to perform an oversampling operation on the input signal Vin, to generate a sampled signal Vin', where a frequency of the clock signal CLK is higher than a frequency of the input signal Vin for enabling the sampling circuit 110 to perform the oversampling operation. For the convenience of following illustration, the frequency of the clock signal CLK in the present embodiment is 40 times the frequency of the input signal Vin, but the present invention is not limited thereto.

Figure 3:
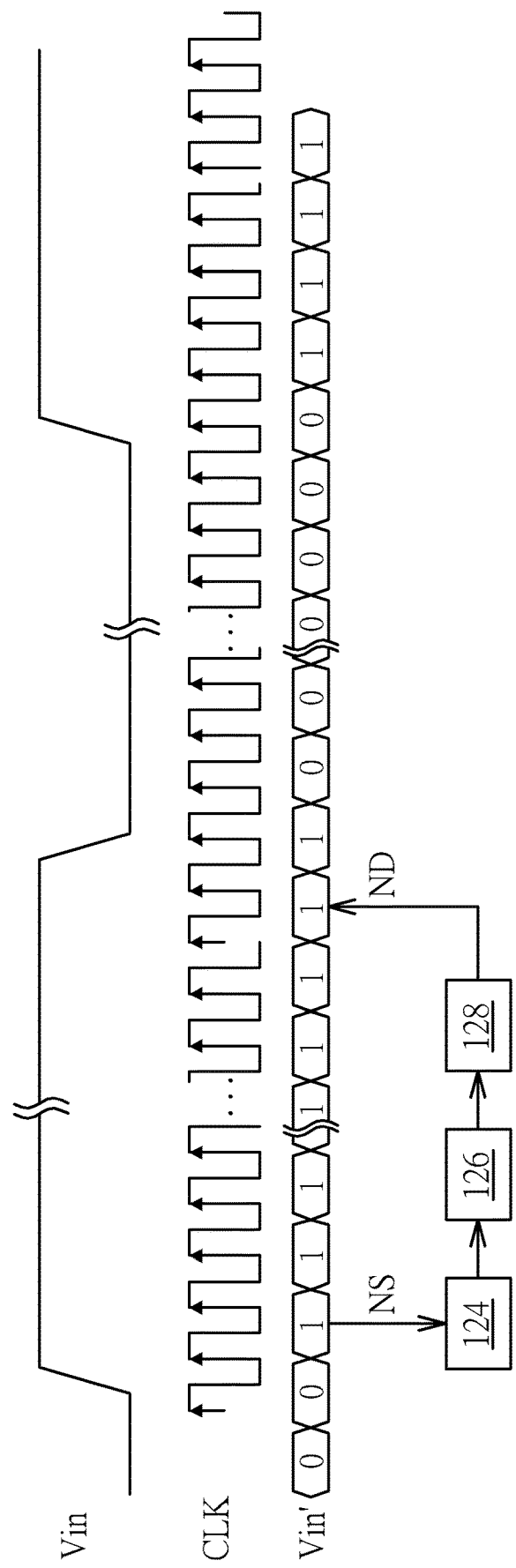
FIG. 3 is a diagram illustrating timing of an input signal, a clock signal and a sampled signal, and an operation of the data sampling point selection circuit.

Please refer to FIG. 2 in conjunction with FIG. 3. FIG. 3 is diagram illustrating timing of an input signal, a clock signal and a sampled signal, and an operation of the data sampling point selection circuit. The input signal Vin in FIG.

3 is shown having a duty cycle of 60% for illustration. Ideally, one cycle of the input signal Vin is 40 times one cycle of the clock signal CLK. In the operation of the data sampling point selection circuit 120, first of all, the start point selection circuit 122 continually receives the sampled signal Vin', and selects a sampling point as the start point, where the selected sampling point is a sampling point when the sampled signal Vin' changes from '0' to '1' (which substantially corresponds to the rising edge of the input signal Vin), that is, a start point data NS substantially represents the time point of the input signal Vin changing from a low voltage level to a high voltage level. In detail, as shown in FIG. 3, the counter 140 can continuously generate a count value CNT according to the clock signal CLK or other related clock signals, where each count value CNT corresponds to one sample value of the sampled signal Vin', and the start point selection circuit 122 can select the count value CNT corresponding to the time when the sampled signal Vin' changes from '0' to '1' as the start point data NS. Then, the filter 124 and the delta-sigma modulation circuit 126 perform a filtering operation on the received start point data NS to generate a filtered start point data NS', such that the filtered start point data NS' can get close to an ideal value. For example, ideally, the interval between two adjacent start points generated by the start point selection circuit 122 is 40, such as the start point data NS generated by the start point selection circuit 122 is 40, 80, 120, 160, 200, 240, and so on. However, each start point data NS may deviate from the ideal value due to the jitter of the input signal Vin (e.g., actually NS=38, 82, 115, etc.). Therefore, the filter 124 and the delta-sigma modulation circuit 126 continually receive the start point data NS, and filter the current start point data NS according to the previous start point data NS, in order to generate the filtered start point data NS' which is close to the ideal value. Then, the output circuit 128 generates a data sampling point ND by adding an offset to the filtered start point data NS', where the offset may be between a first reference value and a second reference value. The first reference value may be the width of the sampled signal Vin' being '1' when the duty cycle of the input signal Vin is 40% (i.e., the number of the sampled signals Vin' continuously being '1'), and the second reference value may be the width of the sampled signal Vin' being '1' when the duty cycle of the input signal Vin is 60% (i.e., the number of the sampled signals Vin' continuously being '1'). For example, assuming that the frequency of the clock signal CLK is 40 times the frequency of the input signal Vin, one cycle of the input signal Vin ideally corresponds to 40 sample values (e.g., the count value CNT) of the sampled signal Vin'. When the duty cycle of the input signal Vin is 40%, the width of the sampled signal Vin' being '1' is '16' (i.e., there are 16 continuous count values CNT corresponding to the sampled signal Vin' being '1'). When the duty cycle of the input signal Vin is 60%, the width of the sampled signal Vin' being '1' is '24' (i.e., there are 24 continuous count values CNT corresponding to the sampled signal Vin' being '1'). At this time, the offset can be selected as the average value '20' of the first reference value '16' and the second reference value '24', and the data sampling point ND may be ND=NS'+20.

Next, the determination circuit 130 receives the data sampling point ND output by the data sampling point selection circuit 120, and at the same time receives the count value CNT from the counter 140 to select the sampling value corresponding to the data sampling point ND of the sampled signal Vin', to further determine the logical value of the digital output signal Dout. Taking FIG. 3 as an example (the duty cycle of the input signal Vin is 60%), if the sample value corresponding to the data sampling point ND (e.g., a 20th sampling point since the filtered start point data NS') of the sampled signal Vin' is '1', this means that the input signal Vin has a duty cycle of 60% because the input signal Vin with the duty cycle of 60% in an ideal state changes at a 24th sampling point of the filtered start point data NS'. At this moment, the logical value of the digital output signal Dout generated by the determination circuit 130 is '1'. In some other embodiments, if the sample value corresponding to the data sampling point ND of the sampled signal Vin' is '0', this means that the input signal Vin has a duty cycle of 40% because the input signal Vin with the duty cycle of 40% in an ideal state changes at a 16th sampling point of the filtered start point data NS'. At this moment, the logical value of the digital output signal Dout generated by the determination circuit 130 is '0'.

According to above arrangement, through the receiver 100 of the present embodiment, the duty cycle of the input signal Vin can be determined more accurately, to further determine the logical value of the digital output signal Dout. In addition, the data sampling point selection circuit 120 and the determination circuit 130 of the receiver 100 can be implemented by all-digital circuits. Therefore, the proportion of analog circuits in the receiver 100 can be reduced, to achieve purposes of rapid development and compatibility with different semiconductor manufacturing processes.

Figure 4:
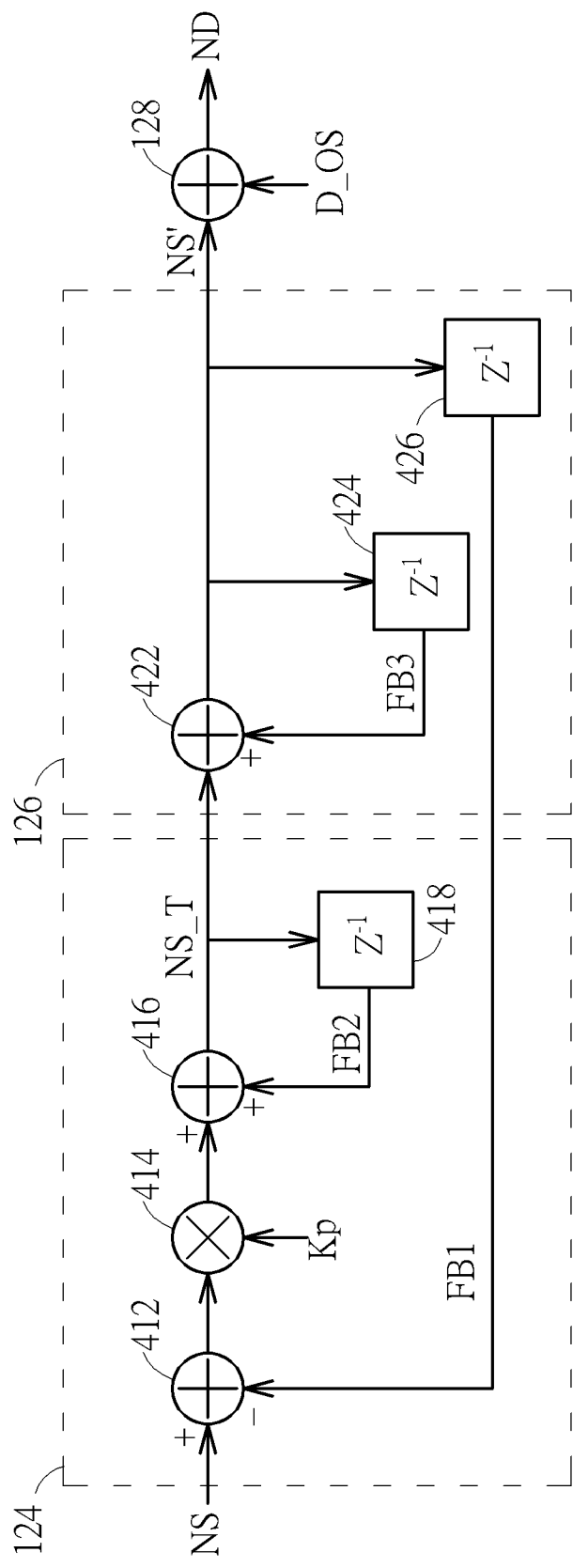
FIG. 4 is a diagram illustrating a filter, a delta-sigma modulation circuit and an output circuit according to an embodiment of the present invention.

FIG. 4 is a diagram illustrating the filter 124, the delta-sigma modulation circuit 126 and the output circuit 128 according to an embodiment of the present invention. As shown in FIG. 4, the filter 124 is a low-pass filter and includes an adder 412, a multiplier 414, an adder 416, and a delay circuit 418; and the delta-sigma modulation circuit 126 includes an adder 422 and two delay circuits 424 and 426; and the output circuit 128 is implemented by an adder 128. In the operation of the filter 124, the adder 412 subtracts a feedback signal FB1 from the start point data NS to generate an output, and the multiplier 414 multiplies the output of the adder 412 by a multiplier Kp, where the multiplier Kp can be a number less than one (e.g., Kp=(1/1024)); and the adder 416 adds a feedback signal FB2 to the output of the multiplier 416 to generate an output signal NS_T; and the delay circuit 418 delays the output signal NS_T by one cycle of the clock signal CLK, and then generates the feedback signal FB2 to the adder 416. In the operation of the delta-sigma modulation circuit 126, the adder 422 subtracts a feedback signal FB3 from the output signal NS_T to generate an output, where the output of the adder 422 may include an integer part and a fractional part, and the integer part may be used as a filtered start point NS', and the fractional part may be input to the delay circuit 424; the delay circuit 424 delays the fractional part of the output by one cycle of the clock signal CLK, and then generate the feedback signal FB3 to the adder 422; and the delay circuit 426 delays the integer part of the output by one cycle of the clock signal CLK, and then generates the feedback signal FB1 to the adder 412. In the present embodiment, the filtered start point NS' includes only the integer part of the output of the adder 422. Therefore, through sending the feedback signal FB3 (i.e., the fractional part of the output of the adder 422) to the adder 422 for being added to the output signal NS_T, an average value in the overall of the filtered start point NS' is identical to or very close to an average value of the output signal NS_T. In addition, the filter 124 traditionally uses the output signal NS_T as the feedback signal (i.e., the adder 412 receives the output signal NS_T). However, considering that the output signal NS_T has the fractional part and may increase the complexity of the circuit design, the present embodiment uses the feedback signal FB1 as the feedback signal that is input to the filter 124 (particularly, the adder 412). Hence, the design of related circuits can be simplified due to the feedback signal FB1 being an integer value. In addition, the output circuit 128 adds an offset D_OS to the filtered start point NS' to generate the data sampling point ND, where the offset D_OS may be '20' in the present embodiment.

It is noted that the structure of the filter 124 and the delta-sigma modulation circuit 126 shown in FIG. 4 is an example for illustration, not a limitation of the present invention. In other embodiments, the filter 124 and the delta-sigma modulation circuit 126 can be implemented by any other suitable low-pass filters. In addition, the delta-sigma modulation circuit 126 shown in FIG. 4 is an optional component. In other embodiments, the delta-sigma modulation circuit 126 can be removed from the data sampling point selection circuit 120 without affecting the normal operation of the receiver 100, that is, an integer part of the output signal NS_T shown in FIG. 4 can be taken to act as the filtered start point data NS'.

In the above embodiment, the receiver 100 supports eARC, and the input signal Vin has only two duty cycles of 40% and 60%. The data sampling point selection circuit of this embodiment uses a filter to filter the start point data NS to generate filtered start point data NS' for the output circuit 128 to generate the data sampling point ND, and then the determination circuit 130 determines the logical value of the digital output signal Dout according to the sampling value corresponding to the data sampling point ND in the sampled signal Vin'. This concept can also be applied to other specifications. Specifically, assuming that the input signal Vin has two duty cycles of A % and B % (A<B) and the frequency of the clock signal CLK is N times the frequency of the input signal Vin, the first reference value in the above embodiment may be (N*A %), the second reference value in the above embodiment may be (N*B %), and the offset D_OS shown in FIG. 4 can be between (N*A %) and (N*B %). For example, the offset D_OS can be an average value of (N*A %) and (N*B %), where it is assumed that that (N*A %) and (N*B %) are integers. If (N*A %) and (N*B %) are not integers, the offset D_OS can be set by a smallest integer that is greater than the average of (N*A %) and (N*B %) or a largest integer that is less than the average of (N*A %) and (N*B %).

In the above embodiment, the start point selection circuit 122 selects the sampling point at the time when the sampled signal Vin' changes from '0' to '1' (i.e., a rising edge) as the start point. However, in other embodiments, the start point selection circuit 122 may select the sampling point at the time when the sampled signal Vin' changes from '1' to '0' (i.e., a falling edge) as the start point. Since those skilled in the art can readily understand the principle of this alternative design after reading the above embodiments, further description is omitted here for simplicity.

Figure 5:
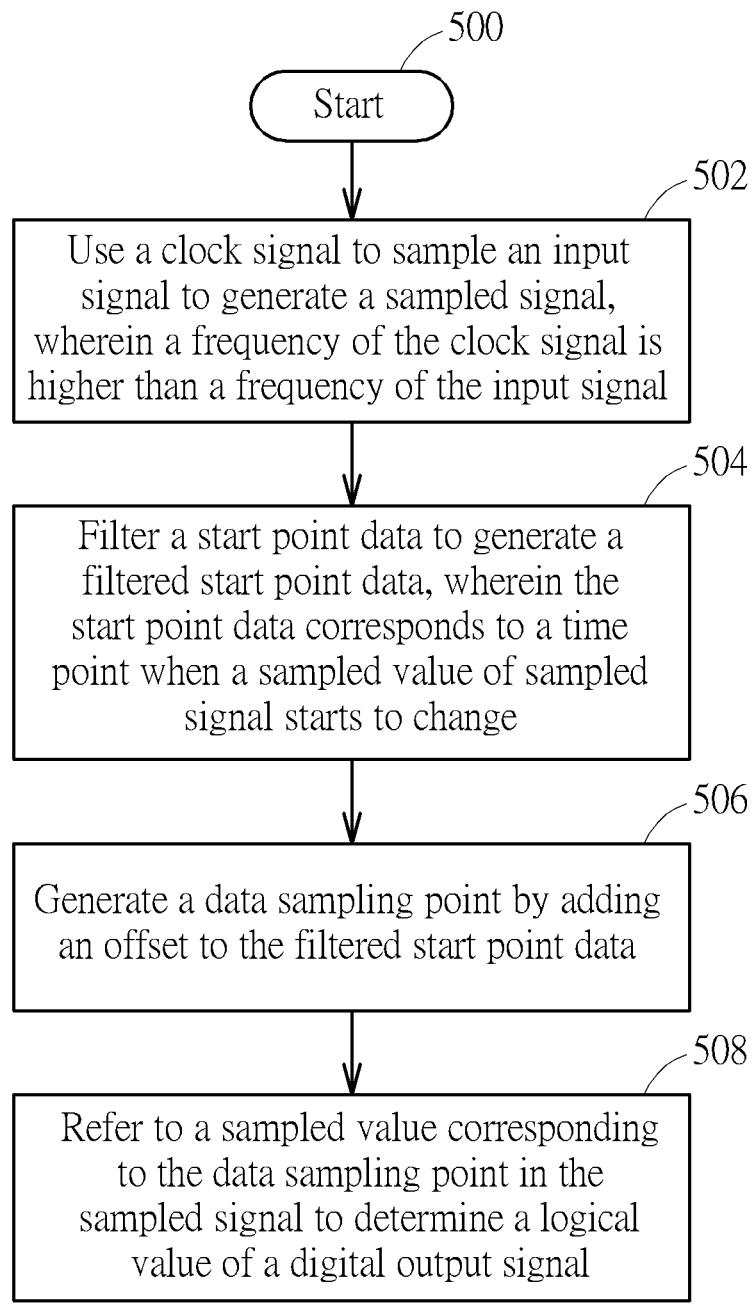
FIG. 5 is a flowchart illustrating a signal processing method applied to a receiver according to an embodiment of the present invention.

FIG. 5 is a flowchart illustrating a signal processing method applied to a receiver according to an embodiment of the present invention. Referring to the description of the above embodiments at the same time, the signal processing method includes the following steps:

Step 500: start.

Step 502: a clock signal is used to sample an input signal to generate a sampled signal, wherein a frequency of the clock signal is higher than a frequency of the input signal.

Step 504: a start point data is filtered to generate a filtered start point data, wherein the start point data corresponds to a time point when a sampled value of sampled signal starts to change.

Step 506: a data sampling point is generated by adding an offset to the filtered start point data.

Step 508: a sampled value corresponding to the data sampling point in the sampled signal is referred to and a logical value of a digital output signal is determined accordingly.

Briefly summarizing the present invention, in the receiver and related signal processing method of the present invention, the data sampling point selection circuit uses a filter to filter the start point data to generate a filtered start point data for the output circuit to generate data sampling point, and then the determination circuit determines the logical value of the digital output signal according to the sampled value corresponding to the data sampling point in the sampled signal. According to above arrangement, the filtered start point data is very close to an ideal value. Therefore, the determination circuit may determine the duty cycle of the input signal more accurately, to further determine the logical value of the digital output signal.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver, comprising:
  a sampling circuit, configured to use a clock signal to sample an input signal to generate a sampled signal, wherein a frequency of the clock signal is higher than a frequency of the input signal;
  a data sampling point selection circuit, coupled to the sampling circuit, configured to filter a start point data to generate a filtered start point data, and to generate a data sampling point by adding an offset to the filtered start point data, wherein the start point data corresponds to a time point at which a sampled value of the sampled signal starts to change; and
  a determination circuit, coupled to the data sampling point selection circuit, configured to refer to a sampled value corresponding to the data sampling point in the sampled signal to determine a logical value of a digital output signal corresponding to the input signal.

2. The receiver of claim 1, wherein the input signal has two duty cycles of A % and B %, the frequency of the clock signal is N times the frequency of the input signal Vin, the offset is between (N*A %) and (N*B %), and the logical value of the digital output signal corresponds to a duty cycle of the input signal.

3. The receiver of claim 2, wherein the offset is an average of (N*A %) and (N*B %).

4. The receiver of claim 1, wherein the data sampling point selection circuit comprises:
  a start point selection circuit, configured to select a count value as the start point data, wherein the count value corresponds to the time point at which the sampled value of sampled signal starts to change;
  a filter, coupled to the start point selection circuit, configured to filter the start point data to generate a filtered start point data; and
  an output circuit, configured to generate the data sampling point by adding the offset to the filtered start point data.

5. The receiver of claim 4, wherein the filter is a low-pass filter, and the data sampling point selection circuit is an all-digital circuit.

6. The receiver of claim 1, wherein the data sampling point selection circuit comprises:
- a start point selection circuit, configured to select a count value as the start point data, wherein the count value corresponds to the time point at which the sampled value of sampled signal starts to change;
- a filter, coupled to the start point selection circuit, configured to filter the start point data to generate a signal;
- a delta-sigma modulation circuit, coupled to the filter, configured to generate a filtered start point data according to the signal; and
- an output circuit, configured to generate the data sampling point by adding the offset to the filtered start point data.

7. The receiver of claim 6, wherein the filter is a low-pass filter, and the data sampling point selection circuit is an all-digital circuit.

8. The receiver of claim 1, wherein the receiver conforms to a specification of an enhanced audio return channel in a high definition multimedia interface.

9. A signal processing method applied to a receiver, comprising:
- using a clock signal to sample an input signal to generate a sampled signal, wherein a frequency of the clock signal is higher than a frequency of the input signal;
- filtering a start point data to generate a filtered start point data, wherein the start point data corresponds to a time point at which a sampled value of sampled signal starts to change;
- generating a data sampling point by adding an offset to the filtered start point data; and
- referring to a sampled value corresponding to the data sampling point in the sampled signal to determine a logical value of a digital output signal corresponding to the input signal.

10. The signal processing method of claim 9, wherein the input signal has two duty cycles of A % and Bo, the frequency of the clock signal is N times the frequency of the input signal Vin, the offset is between (N*A %) and (N*B %), and the logical value of the digital output signal corresponds to a duty cycle of the input signal.

11. The signal processing method of claim 10, wherein the offset is an average of (N*A %) and (N*B %).

* * * * *